(12) United States Patent
Sun et al.

(10) Patent No.: US 11,916,170 B2
(45) Date of Patent: Feb. 27, 2024

(54) MICRO-LIGHT-EMITTING DIODE CHIP AND MICRO-LIGHT-EMITTING DIODE DISPLAY

(71) Applicant: PlayNitride Display Co., Ltd., MiaoLi County (TW)

(72) Inventors: Sheng-Yuan Sun, MiaoLi County (TW); Loganathan Murugan, MiaoLi County (TW); Po-Wei Chiu, MiaoLi County (TW)

(73) Assignee: PlayNitride Display Co., Ltd., Miaoli County (TW)

( * ) Notice: Subject to any disclaimer, the term of this patent is extended or adjusted under 35 U.S.C. 154(b) by 319 days.

(21) Appl. No.: 17/472,704

(22) Filed: Sep. 13, 2021

(65) Prior Publication Data

US 2022/0246800 A1 Aug. 4, 2022

(30) Foreign Application Priority Data

Feb. 4, 2021 (TW) .................................. 110104125

(51) Int. Cl.
*H01L 33/38* (2010.01)
*H01L 25/075* (2006.01)
(Continued)

(52) U.S. Cl.
CPC ........ *H01L 33/382* (2013.01); *H01L 25/0753* (2013.01); *H01L 33/46* (2013.01); *H01L 33/54* (2013.01)

(58) Field of Classification Search
CPC ......... H01L 33/54; H01L 33/46; H01L 33/60; H01L 33/382; H01L 25/0753; H01L 33/56; H01L 25/167; H01L 33/486
See application file for complete search history.

(56) References Cited

U.S. PATENT DOCUMENTS 10,797,264 B2 * 10/2020 Li .......................... H10K 77/111
11,038,083 B2 *  6/2021 Singer ................... H01L 33/486
(Continued)

FOREIGN PATENT DOCUMENTS

| CN | 101529308 | 9/2009 |
| CN | 107785474 | 3/2018 |
| CN | 109075232 | 12/2018 |

OTHER PUBLICATIONS

"Office Action of China Counterpart Application", dated Oct. 31, 2022, p. 1-p. 8.
(Continued)

*Primary Examiner* — Savitri Mulpuri
(74) *Attorney, Agent, or Firm* — JCIPRNET

(57) ABSTRACT

A micro-light-emitting diode chip includes an epitaxial structure, an electrode, a transparent structure, and a reflection layer. The epitaxial structure has a light exit surface, a back surface opposite to the light exit surface, and a sidewall surface. The sidewall surface is connected to the light exit surface and the back surface. The electrode is electrically coupled to the epitaxial structure. The transparent structure has an inner surface and an outer surface opposite to the inner surface. The inner surface is connected to the sidewall surface. A distance between the outer surface and the inner surface on a plane where the back surface is located is less than a distance between the outer surface and the inner surface on a plane where the light exit surface is located. The reflection layer is in direct contact with the outer surface. A micro-light-emitting diode display is also provided.

7 Claims, 6 Drawing Sheets

(51) Int. Cl.
    *H01L 33/46*     (2010.01)
    *H01L 33/54*     (2010.01)

(56) References Cited

U.S. PATENT DOCUMENTS

| | | | |
|---|---|---|---|
| 11,211,525 B2* | 12/2021 | Rajan | H01L 33/385 |
| 11,569,414 B2* | 1/2023 | Shakoor | H01L 33/382 |
| 11,658,267 B2* | 5/2023 | Rajan | H01L 33/04 |
| | | | 257/98 |
| 2018/0212118 A1 | 7/2018 | Chen et al. | |
| 2019/0165226 A1* | 5/2019 | Kim | H01L 33/32 |
| 2020/0058625 A1 | 2/2020 | Chen et al. | |

OTHER PUBLICATIONS

"Office Action of Taiwan Counterpart Application", dated Sep. 17, 2021, p. 1-p. 6.

* cited by examiner

MICRO-LIGHT-EMITTING DIODE CHIP AND MICRO-LIGHT-EMITTING DIODE DISPLAY

CROSS-REFERENCE TO RELATED APPLICATION

This application claims the priority benefit of Taiwan application serial no. 110104125, filed on Feb. 4, 2021. The entirety of the above-mentioned patent application is hereby incorporated by reference herein and made a part of this specification.

BACKGROUND OF THE INVENTION

Field of the Invention

The invention relates to a chip and a display, and more particularly to a micro-light-emitting diode chip and a micro-light-emitting diode display.

Description of Related Art

For micro-light-emitting diode chips (hereinafter referred to as chips) after mass transfer and before packaging, due to the large difference in refractive index from the external environment (such as air), most of the light is reflected multiple times inside the chips and reflected by metal pads at the bottom of the chips and then emitted from the light exit surface (such as the top surface) of the chips. However, after packaging, the difference in refractive index between the chips and the external environment (such as the encapsulation layer) is reduced. As the total area of the side surface of the chips after miniaturization is increased, most of the light easily leaks from the side surface of the chips, resulting in a decrease in the amount of light emitted in the forward direction.

SUMMARY OF THE INVENTION

The invention provides a micro-light-emitting diode chip and a micro-light-emitting diode display to increase the amount of light emitted from the front direction.

A micro-light-emitting diode chip of the invention includes an epitaxial structure, an electrode, a transparent structure, and a reflection layer. The epitaxial structure has a light exit surface, a back surface opposite to the light exit surface, and a sidewall surface. The sidewall surface is connected to the light exit surface and the back surface. The electrode is formed on the epitaxial structure and electrically coupled to the epitaxial structure. The transparent structure has an inner surface and an outer surface opposite to the inner surface. The inner surface is connected to the sidewall surface. A distance between the outer surface and the inner surface on a plane where the back surface is located is less than a distance between the outer surface and the inner surface on a plane where the light exit surface is located. The reflection layer is in direct contact with the outer surface.

A micro-light-emitting diode display of the invention includes a driving substrate and a micro-light-emitting diode chip. The micro-light-emitting diode chip is disposed on a driving substrate and includes an epitaxial structure, an electrode, a transparent structure, and a reflection layer. The epitaxial structure has a light exit surface, a back surface opposite to the light exit surface, and a sidewall surface. The sidewall surface is connected to the light exit surface and the back surface. The electrode is electrically coupled to the epitaxial structure. The transparent structure has an inner surface and an outer surface opposite to the inner surface. The inner surface is connected to the sidewall surface. A distance between the outer surface and the inner surface on a plane where the back surface is located is less than a distance between the outer surface and the inner surface on a plane where the light exit surface is located. The reflection layer is in direct contact with the outer surface. The micro-light-emitting diode chip is bonded on the driving substrate via the electrode.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

In the present specification, wordings used to indicate direction, such as "up," "down," "front," "back," "left," and "right", merely refer to directions in the figures. Therefore, the directional terms are used to illustrate and are not intended to limit the invention.

The figures depict typical features of the methods, structures, or materials used in the particular embodiments. However, the figures are not to be interpreted as defining or limiting the scope or nature of the embodiments. For example, the relative size, thickness, and location of layers, regions, or structures may be reduced or enlarged for clarity.

Terms such as "first" and "second" as used in this specification or the claims are used to identify different devices or to distinguish different embodiments or ranges, and are not intended to limit the upper limit or the lower limit of the number of devices and are also not intended to limit the order of manufacture of the devices or the order in which the devices are arranged. Furthermore, the arrangement of one device/layer on (or above) another device/layer may include the case in which the device/layer is disposed directly on (or above) the other device/layer, and two devices/layers are in direct contact; and the case in which the device/layer is disposed indirectly on (or above) the other device/layer and one or a plurality of devices/layers are present between the two devices/layers.

Figure 1:
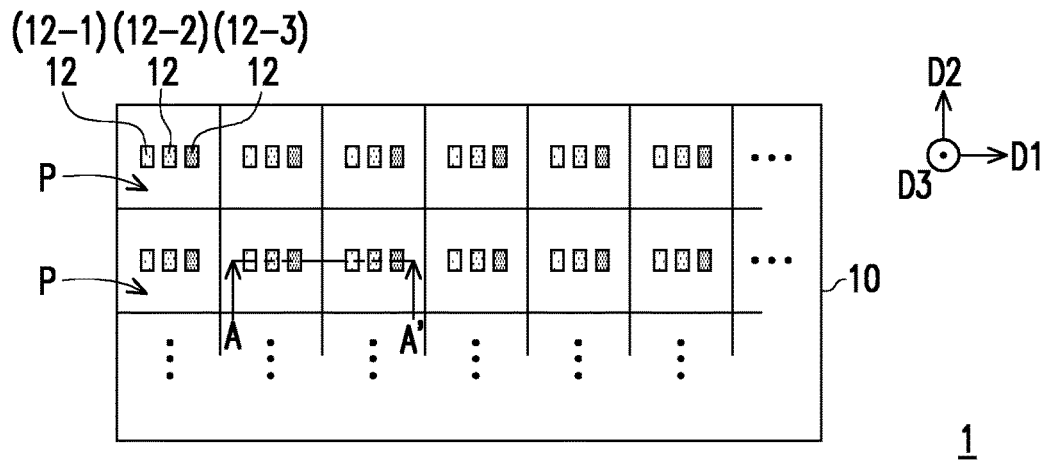
FIG. 1 is a schematic partial top view of a micro-light-emitting diode display according to an embodiment of the invention.
Figure 2:
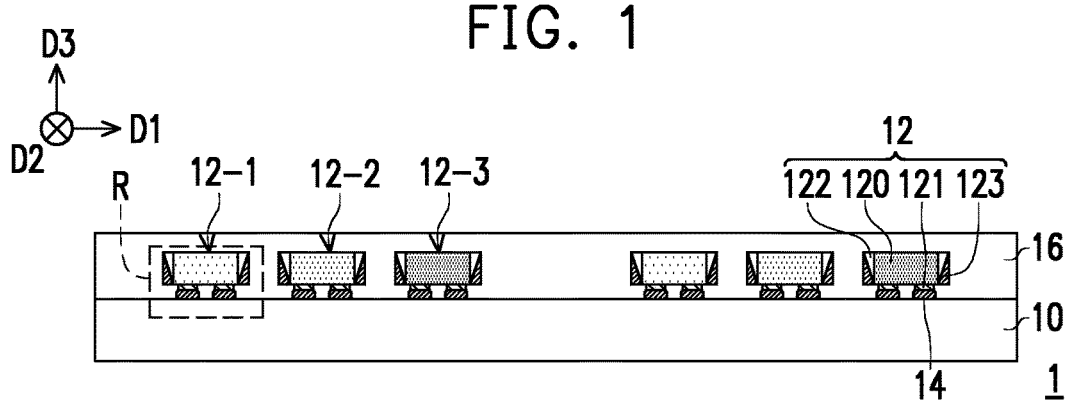
FIG. 2 is a schematic cross-sectional view along section line A-A' in FIG. 1.
Figure 3:
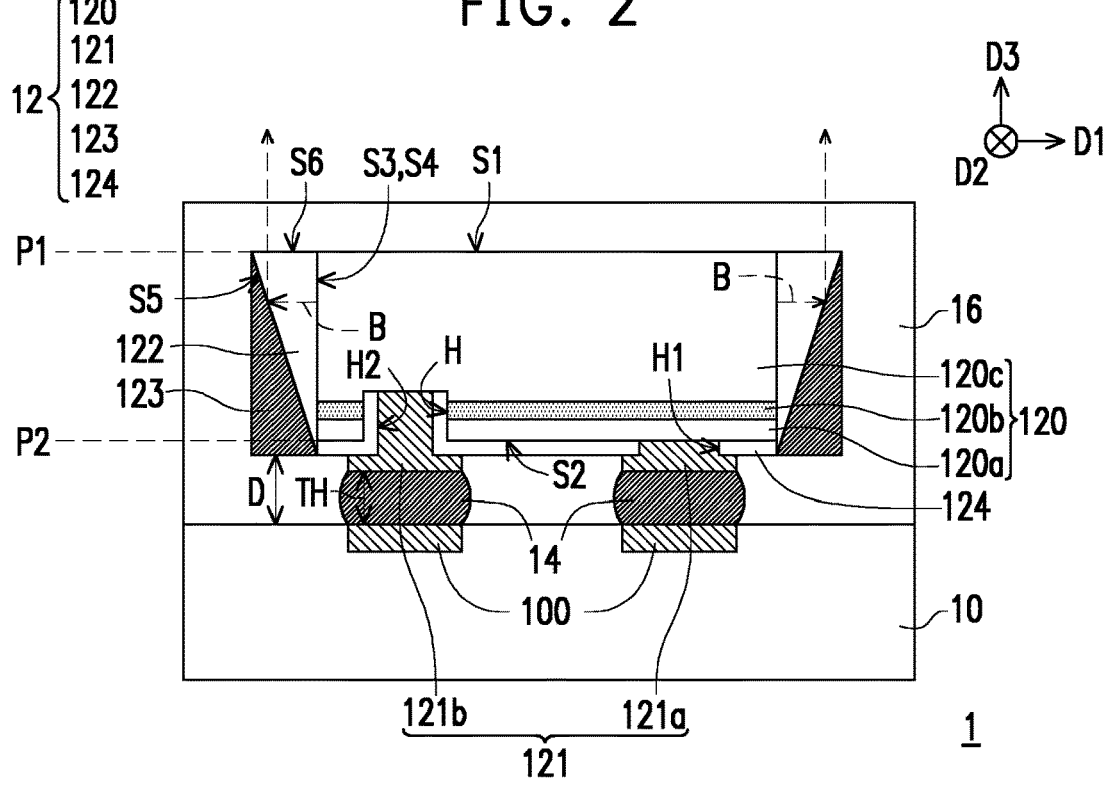
FIG. 3 is an enlarged schematic diagram of a region R in FIG. 2.

FIG. 1 is a schematic partial top view of a micro-light-emitting diode display according to an embodiment of the invention. FIG. 2 is a schematic cross-sectional view along section line A-A' in FIG. 1. FIG. 3 is an enlarged schematic diagram of a region R in FIG. 2.

Referring to FIG. 1 to FIG. 3, a micro-light-emitting diode display 1 may include a driving substrate 10 and a micro-light-emitting diode chip 12, but the invention is not limited thereto. One or a plurality of elements or layers may be added to or removed from the micro-light-emitting diode display 1 as needed.

The driving substrate 10 may be used to carry the micro-light-emitting diode chip 12. For example, the driving substrate 10 may include a circuit substrate, a display substrate, a lighting substrate, a substrate with transistors or integrated circuits (ICs), or a substrate with metal redistribution lines, which is not limited here.

In some embodiments, as shown in FIG. 3, the driving substrate 10 may include pads 100 embedded therein. However, in other embodiments not shown, the pads may also be disposed on the bonding surface of the driving substrate 10.

The micro-light-emitting diode chip 12 is disposed on the driving substrate 10. In some embodiments, as shown in FIG. 3, the micro-light-emitting diode chip 12 may be electrically connected to the pads 100 of the driving substrate 10 via conductive bumps 14. The conductive bumps 14 may include solder balls or other electrical bonding media, such as conductive paste or conductive adhesive, but the invention is not limited thereto.

As shown in FIG. 1, the micro-light-emitting diode display 1 may include a plurality of micro-light-emitting diode chips 12. The plurality of micro-light-emitting diode chips 12 are arranged in an array and bonded on the driving substrate 10. Although FIG. 1 schematically illustrates thirty-six micro-light-emitting diode chips 12, the total number of the micro-light-emitting diode chips 12 may be changed as needed.

In some embodiments, the plurality of micro-light-emitting diode chips 12 may include a plurality of first micro-light-emitting diode chips 12-1, a plurality of second micro-light-emitting diode chips 12-2, and a plurality of third micro-light-emitting diode chips 12-3. The plurality of first micro-light-emitting diode chips 12-1, the plurality of second micro-light-emitting diode chips 12-2, and the plurality of third micro-light-emitting diode chips 12-3 may be micro-light-emitting diode chips of different colors. For example, the plurality of first micro-light-emitting diode chips 12-1 may be micro red light-emitting diode chips, the plurality of second micro-light-emitting diode chips 12-2 may be micro green light-emitting diode chips, and the plurality of third micro-light-emitting diode chips 12-3 may be micro blue light-emitting diode chips, but the color type of the plurality of micro-light-emitting diode chips 12 is not limited thereto.

The plurality of first micro-light-emitting diode chips 12-1, the plurality of second micro-light-emitting diode chips 12-2, and the plurality of third micro-light-emitting diode chips 12-3 may be arranged in an array. For example, the plurality of first micro-light-emitting diode chips 12-1, the plurality of second micro-light-emitting diode chips 12-2, and the plurality of third micro-light-emitting diode chips 12-3 may be alternately arranged along a first direction D1, and a plurality of micro-light-emitting diode chips of the same color may be arranged along a second direction D2, but the invention is not limited thereto. The first direction D1 and the second direction D2 are intersected with each other and may be perpendicular to the thickness direction (such as a third direction D3) of the driving substrate 10. FIG. 1 schematically illustrates that the first direction D1 and the second direction D2 are perpendicular to each other, but the angle between the first direction D1 and the second direction D2 is not limited to 90 degrees.

The micro-light-emitting diode display 1 may include a plurality of pixels P. FIG. 1 schematically shows twelve pixels P, and these pixels P are arranged along the first direction D1 and the second direction D2, but the total number and arrangement of the pixels P may be changed as needed. Moreover, although FIG. 1 schematically shows that each of the pixels P includes one first micro-light-emitting diode chip 12-1, one second micro-light-emitting diode chip 12-2, and one third micro-light-emitting diode chip 12-3, the number, color type, or arrangement of the micro-light-emitting diode chips 12 included in each of the pixels P may be changed as needed.

Referring to FIG. 2, the micro-light-emitting diode chips 12 may include an epitaxial structure 120, an electrode 121, a transparent structure 122, and a reflection layer 123, but the invention is not limited thereto. One or a plurality of elements or layers may be added to or removed from the micro-light-emitting diode chips 12 as needed. For example, as shown in FIG. 3, the micro-light-emitting diode chip 12 may further include an insulating layer 124, but the invention is not limited thereto.

The epitaxial structure 120 may include a first-type semiconductor layer 120a, a light-emitting layer 120b, and a second-type semiconductor layer 120c sequentially stacked along the third direction D3. One of the first-type semiconductor layer 120a and the second-type semiconductor layer 120c may be a P-type semiconductor layer, and the other of the first-type semiconductor layer 120a and the second-type semiconductor layer 120c may be an N-type semiconductor layer. The light-emitting layer 120b may have a multiple quantum well (MQW) structure, but the invention is not limited thereto.

The epitaxial structure 120 may have an opening H. The opening H penetrates the first-type semiconductor layer 120a and the light-emitting layer 120b and exposes a part of the second-type semiconductor layer 120c. The insulating layer 124 is disposed on the lower surface of the first-type semiconductor layer 120a and extended into the opening H. The insulating layer 124 may have an opening H1 and an opening H2. The opening H1 exposes a part of the first-type semiconductor layer 120a. The opening H2 is located in the opening H, and the opening H2 exposes less part of the second-type semiconductor layer 120c than the opening H.

The epitaxial structure 120 has a light exit surface S1, a back surface S2, and a sidewall surface S3. The back surface S2 is opposite to the light exit surface S1, and the back surface S2 is located between the driving substrate 10 and the light exit surface S1, for example. The sidewall surface S3 is connected to the light exit surface S1 and the back surface S2, and the total area of the sidewall surface S3 is, for example, greater than the area of the light exit surface S1. In the present embodiment, the sidewall surface S3 is, for example, a vertical surface parallel to the third direction D3, but the invention is not limited thereto.

The electrode 121 is formed on the epitaxial structure 120 and electrically coupled to the epitaxial structure 120, and the micro-light-emitting diode chip 12 may be bonded on the driving substrate 10 via the electrode 121. Taking the micro-light-emitting diode chip 12 adopting a flip-chip packaging technique as an example, as shown in FIG. 3, the electrode 121 may include a first electrode 121a and a second electrode 121b. The first electrode 121a is disposed on the lower surface of the insulating layer 124 and extended into the opening H1, and is in contact with the first-type semiconductor layer 120a. The second electrode 121b is disposed on the lower surface of the insulating layer 124 and extended into the opening H2. The second electrode 121*b* extended into the opening H2 is electrically insulated from the first-type semiconductor layer 120*a* via the insulating layer 124 extended into the opening H, and the second electrode 121*b* extended into the opening H2 is in contact with the second-type semiconductor layer 120*c*. The material of the first electrode 121*a* and the second electrode 121*b* may include metal, alloy, or a combination thereof, but the invention is not limited thereto.

The transparent structure 122 is disposed next to the epitaxial structure 120. For example, the transparent structure 122 may surround the sidewall surface S3 of the epitaxial structure 120, but the invention is not limited thereto. The material of the transparent structure 122 may include an acrylic material, a silicon adhesive, a resin material, silicon dioxide, or other light-transmitting high refractive index materials. For example, the refractive index of the transparent structure 122 may be greater than the refractive index of air (the refractive index of air is 1) and less than the refractive index of the epitaxial structure 120. More specifically, the refractive index of the transparent structure 122 may be less than the refractive index of any layer in the epitaxial structure 120 or less than the average refractive index of the first-type semiconductor layer 120*a*, the light-emitting layer 120*b*, and the second-type semiconductor layer 120*c*.

The transparent structure 122 may have an inner surface S4 and an outer surface S5. The inner surface S4 of the transparent structure 122 is in contact with and connected to the sidewall surface S3 of the epitaxial structure 120. The outer surface S5 is opposite to the inner surface S4. In the present embodiment, the distance (for example, close to zero) between the outer surface S5 and the inner surface S4 on a plane (such as a plane P2) where the back surface S2 is located is less than the distance (for example, the width of a top surface S6 in the first direction D1) on a plane (such as a plane P1) where the light exit surface S1 is located, so that the overall cross-sectional shape of the transparent structure 122 and the epitaxial structure 120 is generally an upside-down trapezoid.

FIG. 3 schematically illustrates that the cross-sectional shape of the transparent structure 122 is an upside-down right triangle, wherein the outer surface S5 is an inclined surface inclined with respect to the top surface S6 or the light exit surface S1. That is, the included angle between the outer surface S5 and the top surface S6 is greater than 0 degrees and less than 90 degrees. However, the cross-sectional shape of the transparent structure 122 is not limited thereto. As shown in FIG. 3, the outer surface S5 may be connected to the inner surface S4 at a plane (such as the plane P2) close to the back surface S2 of the epitaxial structure 120. In addition to the inner surface S4 and the outer surface S5, the transparent structure 122 may also have the top surface S6. The top surface S6 may be disposed around the periphery of the light exit surface S1. In addition, the top surface S6 may be connected to the outer surface S5, the inner surface S4, and the light exit surface S1 at a plane (such as the plane P1) close to the light exit surface S1 of the epitaxial structure 120. In some embodiments, the top surface S6 of the transparent structure 122 may be aligned with the light exit surface S1 of the epitaxial structure 120, but the invention is not limited thereto. In other embodiments not shown, the top surface S6 of the transparent structure 122 may be slightly higher or lower than the light exit surface S1 of the epitaxial structure 120, or the top surface S6 of the transparent structure 122 may be slightly inclined with respect to the light exit surface S1 of the epitaxial structure 120, but the invention is not limited thereto.

The reflection layer 123 is in direct contact with the outer surface S5, and the reflection layer 123 may completely cover the outer surface S5, but the invention is not limited thereto. The material of the reflection layer 123 may include any material with high reflectivity (such as greater than 50%) to visible light, such as white photoresist, white resin, epoxy resin containing highly reflective particles, metal, alloy, or a combination thereof. Alternatively, the reflection layer 123 may also include a distributed bragg reflector (DBR), that is, the reflection layer 123 may be formed by stacking a plurality of layers of materials with different refractive indices.

In the present embodiment, the cross-sectional shape of the reflection layer 123 is a right triangle, and the cross-sectional shape of the reflection layer 123 and the cross-sectional shape of the transparent structure 122 are upside-down and reversed left and right, but the cross-sectional shape of the reflection layer 123 may be changed as needed and is not limited to that shown in FIG. 3.

By disposing the transparent structure 122 for which the outer surface S5 is an inclined surface on the sidewall surface S3 of the epitaxial structure 120 and disposing the reflection layer 123 on the outer surface S5 of the transparent structure 122, a lateral light B may be reflected by the reflection layer 123, so that the lateral light B is turned to the forward direction and emitted from the micro-light-emitting diode chip 12, thereby increasing the amount or brightness of the light emitted from the forward direction. In some embodiments, the thickness of the micro-light-emitting diode chip 12 (that is, the distance between the light exit surface S1 and the bottom surface of the electrode 121 in the third direction D3) does not exceed 10 microns. That is, the thickness of the micro-light-emitting diode chip 12 is smaller than 10 microns.

According to different requirements, the micro-light-emitting diode display 1 may further include other elements or layers. For example, the micro-light-emitting diode display 1 may further include an encapsulation layer 16. The encapsulation layer 16 is disposed on the driving substrate 10 and covers the micro-light-emitting diode chip 12 and the conductive bumps 14. The material of the encapsulation layer 16 may be any material that may block water vapor or provide device protection, which is not limited here.

Figure 4A:
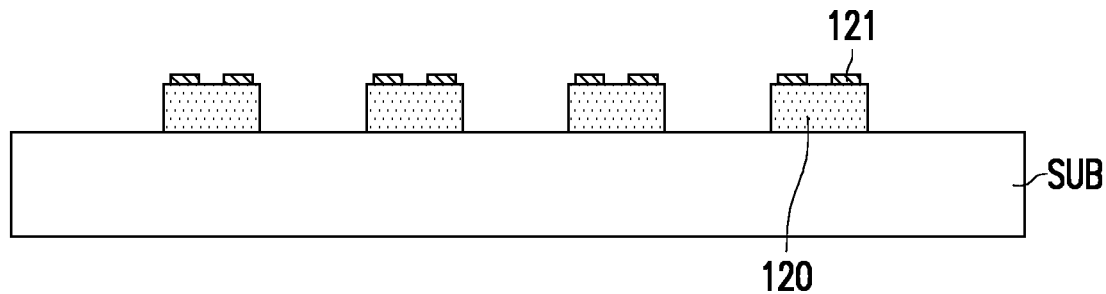
FIG. 4A to FIG. 4F are partial cross-sectional schematic diagrams of a manufacturing process of the micro-light-emitting diode display of FIG. 2.

FIG. 4A to FIG. 4F are partial cross-sectional schematic diagrams of a manufacturing process of the micro-light-emitting diode display 1 of FIG. 2. Referring to FIG. 4A, a plurality of epitaxial structures 120 separated from each other are formed on a growth substrate SUB, and the opening H (see FIG. 3), the insulating layer 124 (see FIG. 3), and the electrode 121 are sequentially formed on the plurality of epitaxial structures 120.

Figure 4B:
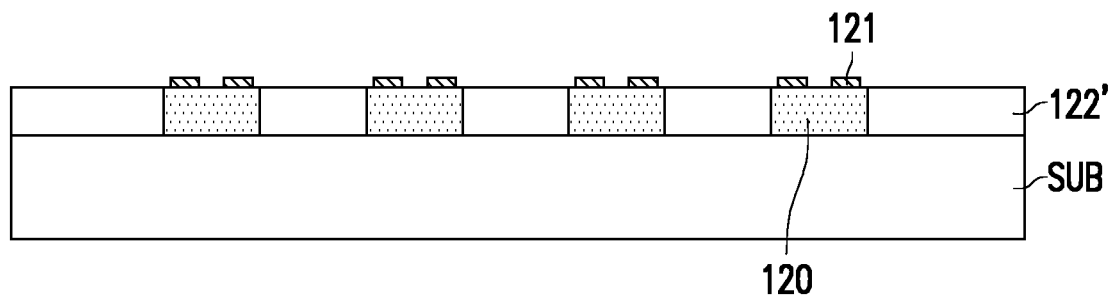

Referring to FIG. 4B, a transparent material 122' is formed on the growth substrate SUB by a method such as coating or deposition. The transparent material 122' covers the plurality of epitaxial structures 120 and exposes the electrode 121.

Figure 4C:
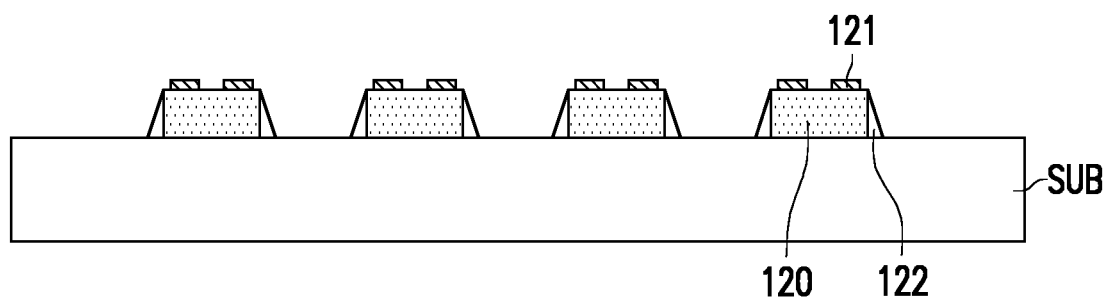

Referring to FIG. 4C, a patterning process (such as an etching process) is performed on the transparent material 122', and the process conditions (such as etching conditions) are controlled to form the transparent structure 122 for which the width is decreased from the light exit surface of the epitaxial structure 120 toward the back surface of the epitaxial structure 120.

Figure 4D:
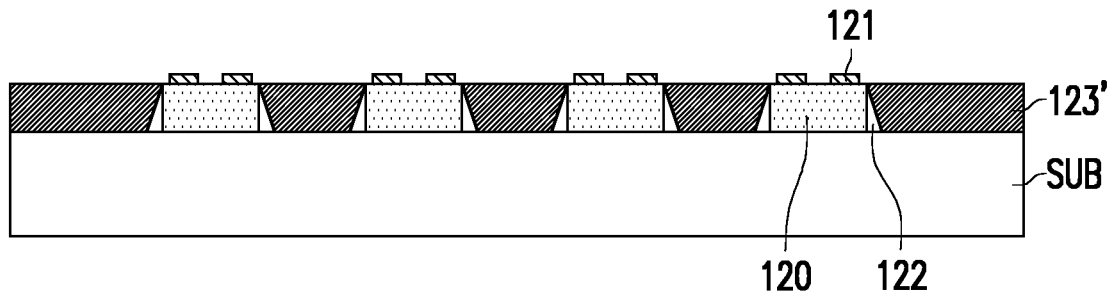

Referring to FIG. 4D, a reflection material 123' is formed on the growth substrate SUB by a method such as coating or deposition. The reflection material 123' covers the transparent structure 122 and exposes the electrode 121.

Figure 4E:
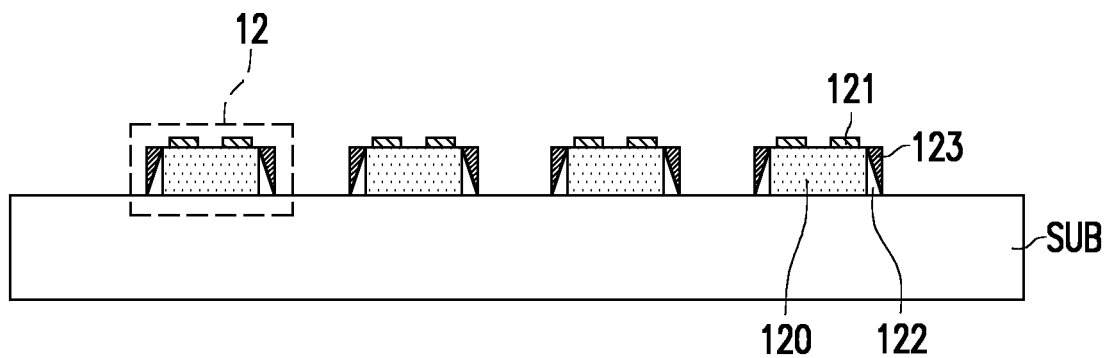

Referring to FIG. 4E, a patterning process (such as an etching process) is performed on the reflection material 123' to form the reflection layer 123. In this way, the manufacture of the plurality of micro-light-emitting diode chips 12 (such as the plurality of first micro-light-emitting diode chips 12-1 shown in FIG. 2) is completed.

Figure 4F:
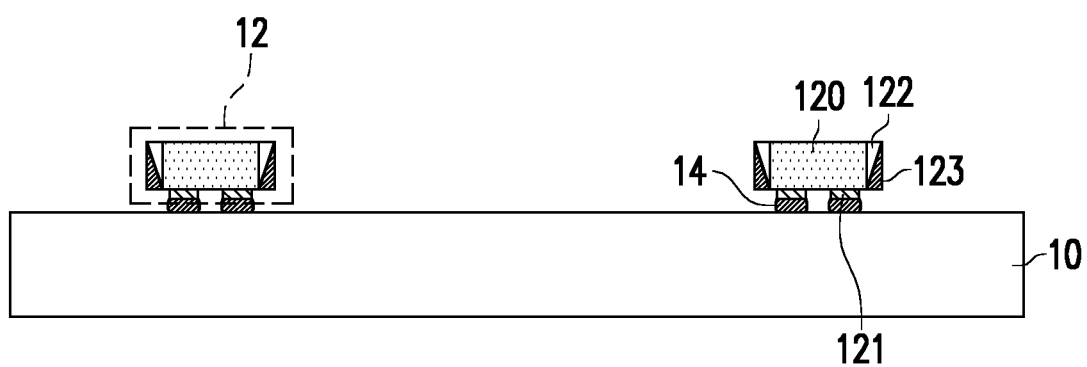

Referring to FIG. 4F, the plurality of micro-light-emitting diode chips 12 are transferred onto the driving substrate 10 by mass transfer. Next, the steps of FIG. 4A to FIG. 4F may be repeated to transfer the plurality of second micro-light-emitting diode chips 12-2 and the plurality of third micro-light-emitting diode chips 12-3 grown on different growth substrates onto the driving substrate 10, respectively. Then, an encapsulation layer may be formed on the driving substrate 10 to complete the manufacture of the micro-light-emitting diode display.

Since the transparent structure 122 and the reflection layer 123 are formed at the periphery of the epitaxial structure 120 before the mass transfer instead of being formed at the periphery of the epitaxial structure 120 after the mass transfer, that is, the transparent structure 122 and the reflection layer 123 together with the epitaxial structure 120, the electrode 121, and the insulating layer 124 (if any) together form a chip structure (the micro-light-emitting diode chips 12), wherein the electrode 121 is located at the back surface S2 of the epitaxial structure 120, and the electrode 121 is protruded from the reflection layer 123 and the transparent structure 122. Therefore, when the micro-light-emitting diode chips 12 are disposed on the driving substrate 10, the transparent structure 122 and the reflection layer 123 may not be in contact with the driving substrate 10. As shown in FIG. 3, under the architecture in which the micro-light-emitting diode chip 12 is disposed on the driving substrate 10 via the conductive bumps 14, a distance D between the reflection layer 123 and the driving substrate 10 may be greater than a thickness TH of the conductive bumps 14, but the invention is not limited thereto.

In the following embodiments, the same or similar devices are designated by the same or similar reference numerals, and the description thereof is omitted. In addition, the features in different embodiments may be combined with each other without conflict, and simple equivalent changes and modifications made by the present specification or the claims are still within the scope of this patent.

FIG. 5 to FIG. 10 are respectively partial cross-sectional schematic diagrams of micro-light-emitting diode displays according to other embodiments of the invention. FIG. 5, FIG. 6, FIG. 7, and FIG. 10 schematically illustrate one micro-light-emitting diode chip in a micro-light-emitting diode display. However, it should be understood that the number of micro-light-emitting diode chips in the micro-light-emitting diode display may be changed as needed.

Please refer to FIG. 5, a micro-light-emitting diode display 2 is similar to the micro-light-emitting diode display 1 of FIG. 3, and the main differences between the two are as follows.

In a micro-light-emitting diode chip 22 of the micro-light-emitting diode display 2, the sidewall surface S3 of an epitaxial structure 220 is an inclined surface inclined with respect to the light exit surface S1 and the back surface S2, wherein the included angle between the sidewall surface S3 and the back surface S2 is greater than the included angle between the sidewall surface S3 and the light exit surface S1, so that the cross-sectional shape of the epitaxial structure 220 is generally an upside-down trapezoid.

The inner surface S4 of the transparent structure 222 is connected to the sidewall surface S3. Therefore, the inner surface S4 of the transparent structure 222 is inclined according to the sidewall surface S3 of the epitaxial structure 220, and the inner surface S4 of the transparent structure 222 and the sidewall surface S3 of the epitaxial structure 220 have the same slope. The outer surface S5 of the transparent structure 222 is not parallel to the sidewall surface S3 of the epitaxial structure 220, and the outer surface S5 of the transparent structure 222 may be more inclined than the sidewall surface S3 of the epitaxial structure 220. That is, the included angle between the sidewall surface S3 and the light exit surface S1 is greater than the included angle between the outer surface S5 and the top surface S6.

A reflection layer 223 is disposed on the outer surface S5, and the reflection layer 223 is, for example, a reflective thin film, such as a distributed bragg reflector, but the invention is not limited thereto. In other embodiments not shown, the reflection layer 223 may also be replaced with the reflection layer 123 of FIG. 3.

Please refer to FIG. 6, a micro-light-emitting diode display 3 is similar to the micro-light-emitting diode display 2 of FIG. 5, and the main differences between the two are as follows.

In a micro-light-emitting diode chip 32 of the micro-light-emitting diode display 3, in addition to the inner surface S4, the outer surface S5, and the top surface S6, the transparent structure 322 further has a bottom surface S7. The bottom surface S7 is opposite to the top surface S6 and is connected between the inner surface S4 and the outer surface S5. Moreover, the width of the bottom surface S7 in the first direction D1 is less than the width of the top surface S6 in the first direction D1, so that the outer surface S5 is inclined outward (that is, the included angle between the outer surface S5 and the bottom surface S7 is greater than the included angle between the outer surface S5 and the top surface S6). Therefore, the lateral light B may be turned to the forward direction by the reflection layer 223 disposed on the outer surface S5 and emitted from the micro-light-emitting diode chip 32, thereby increasing the amount or brightness of the light exiting from the forward direction. In other embodiments not shown, the reflection layer 223 may also be replaced with the reflection layer 123 of FIG. 3.

Figure 7:
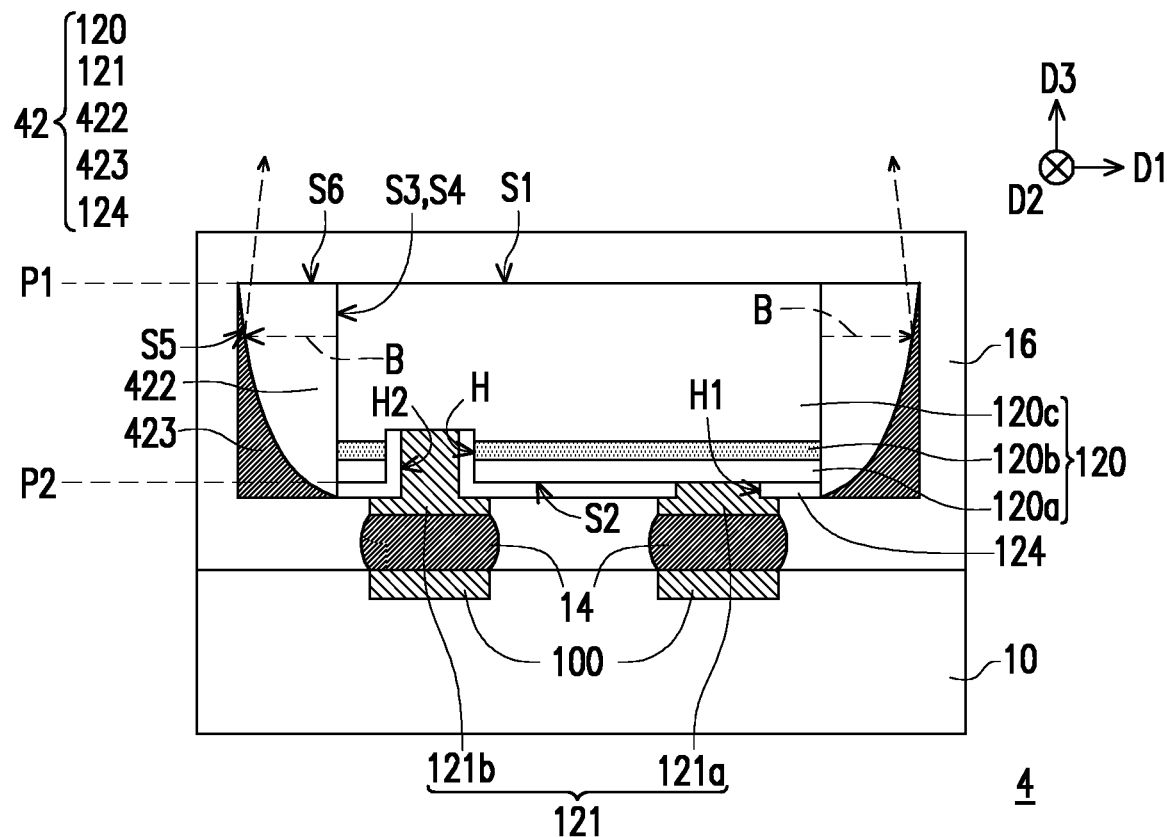

Please refer to FIG. 7, a micro-light-emitting diode display 4 is similar to the micro-light-emitting diode display 1 of FIG. 3, and the main differences between the two are as follows.

In a micro-light-emitting diode chip 42 of the micro-light-emitting diode display 4, the outer surface S5 of a transparent structure 422 is a curved surface. With the curvature design of the outer surface S5, the angle at which the lateral light B exits from the micro-light-emitting diode chip 42 may be controlled. In some embodiments not shown, the outer surface S5 may include an inclined surface, a curved surface, or a combination thereof. For example, the outer surface S5 may be composed of a combination of a plurality of inclined surfaces with different slopes, a combination of curved surfaces with different curvatures, or a combination of one or a plurality of inclined surfaces and one or a plurality of curved surfaces. The curved surface may include a spherical surface, an aspheric surface, an arc surface, etc., which is not limited here.

Figure 5:
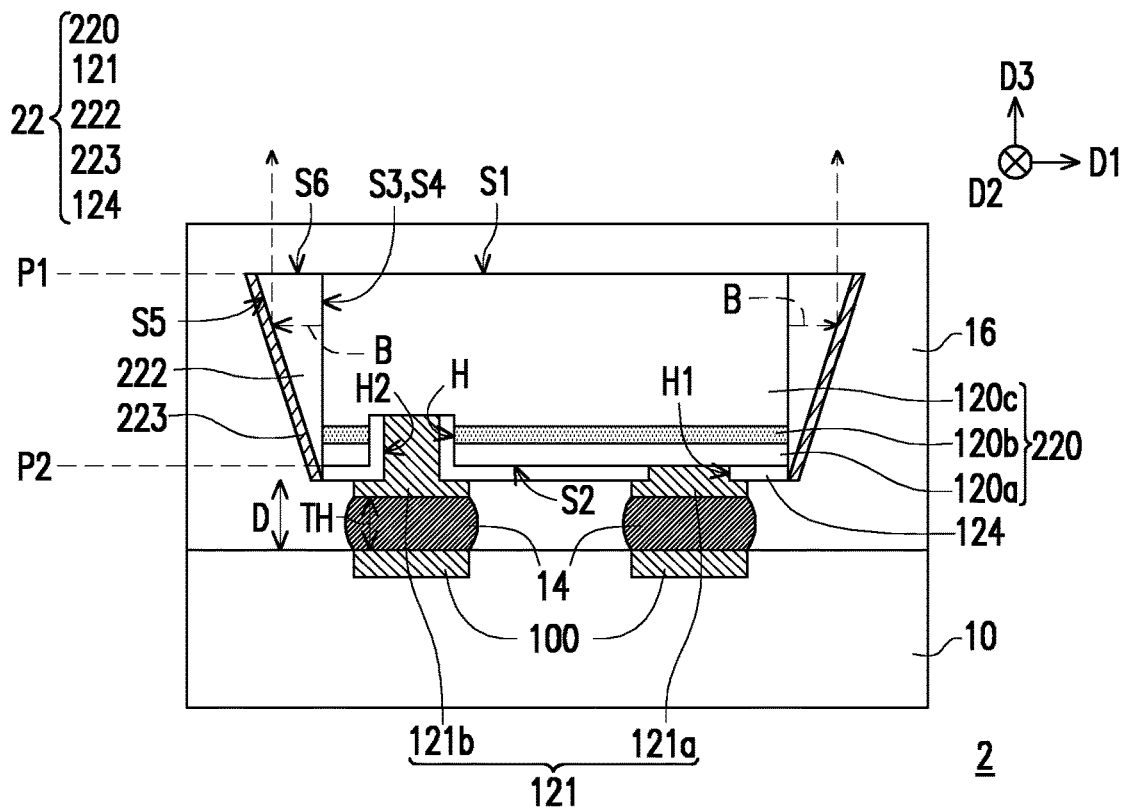
FIG. 5 to FIG. 10 are respectively partial cross-sectional schematic diagrams of micro-light-emitting diode displays according to other embodiments of the invention.
Figure 6:
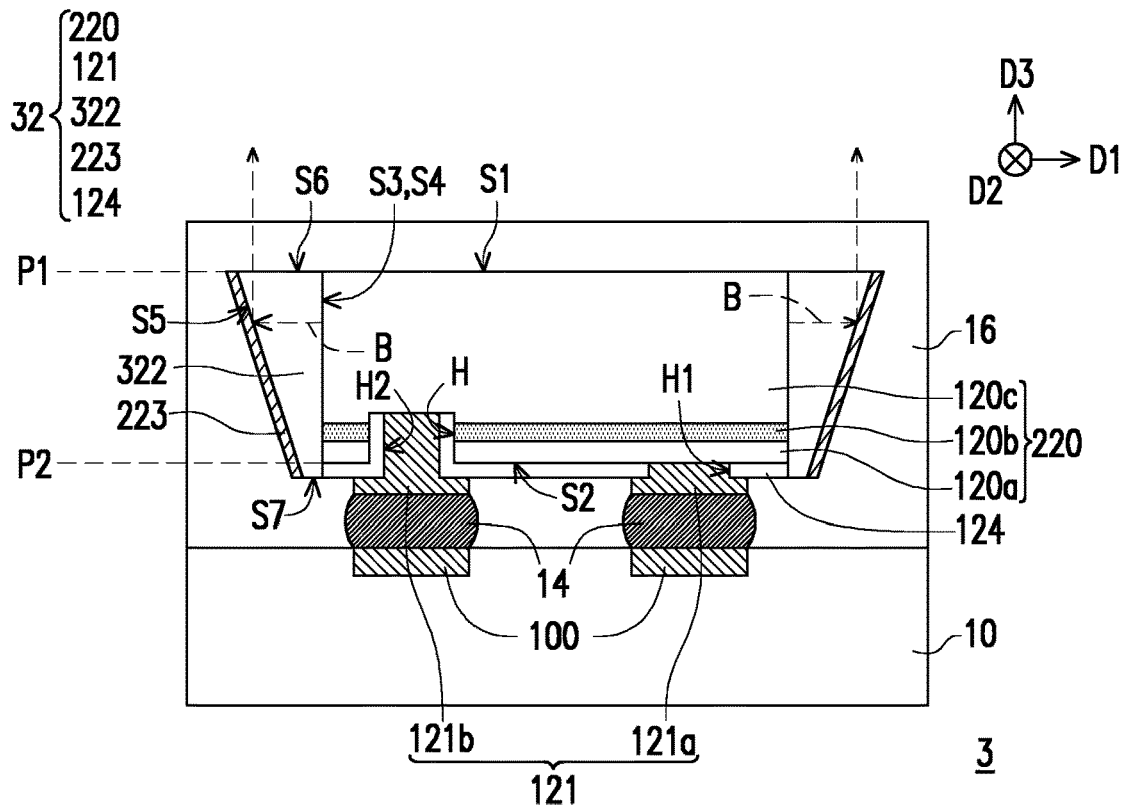

In other embodiments not shown, the epitaxial structure 120 may also be replaced with the epitaxial structure 220 of FIG. 5 (the sidewall surface S3 is an inclined surface). In addition, the reflection layer 423 may also be replaced with the reflection layer 223 (reflective thin film) of FIG. 5.

Please refer to FIG. 8, a micro-light-emitting diode display 5 is similar to the micro-light-emitting diode display 1 of FIG. 2, and the main differences between the two are as follows.

Figure 8:
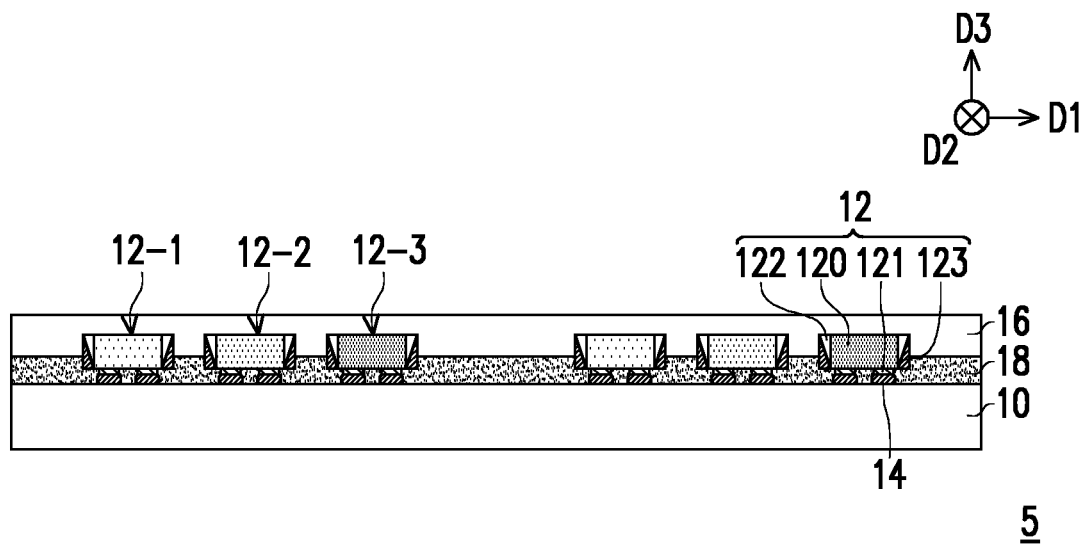

In FIG. 8, the micro-light-emitting diode display 5 further includes a light-shielding layer 18. The light-shielding layer 18 is disposed on the driving substrate 10 and located in a region outside the micro-light-emitting diode chips 12. The light-shielding layer 18 may be a black matrix, for example, but the invention is not limited thereto.

Please refer to FIG. 9, a micro-light-emitting diode display 6 is similar to the micro-light-emitting diode display 5 of FIG. 8, and the main differences between the two are as follows.

Figure 9:
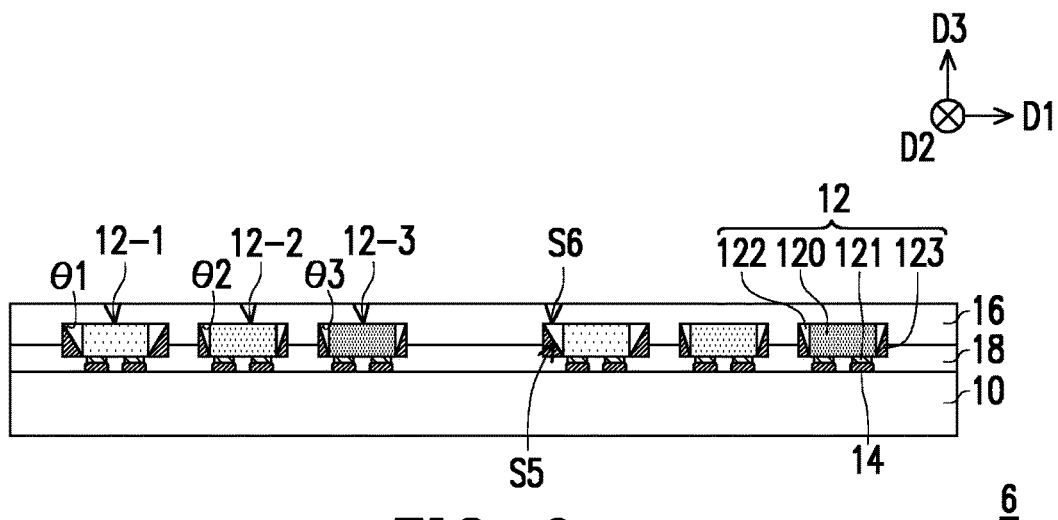

In FIG. 9, the outer surface S5 of the transparent structure 122 in the first micro-light-emitting diode chips 12-1 has a smaller inclination angle than the outer surface S5 of the transparent structure 122 in the second micro-light-emitting diode chips 12-2. The inclination angle refers to the included angle between the outer surface S5 of the transparent structure 122 and the top surface S6 of the transparent structure 122. FIG. 9 schematically illustrates that an inclination angle θ1 in the first micro-light-emitting diode chips 12-1 is less than an inclination angle θ2 in the second micro-light-emitting diode chips 12-2, and the inclination angle θ2 in the second micro-light-emitting diode chips 12-2 is equal to an inclination angle θ3 in the third micro-light-emitting diode chips 12-3, but the size of these inclination angles may be changed as needed. With the design of different inclination angles, the light pattern of the micro-light-emitting diode chips of different colors may be adjusted. For example, a micro-light-emitting diode chip with a larger light exit angle may be matched with a larger inclination angle. In the present embodiment, the light-emitting wavelength of the first micro-light-emitting diode chips 12-1 is, for example, greater than the light-emitting wavelength of the second micro-light-emitting diode chips 12-2.

Moreover, the top surface S6 of the transparent structure 122 in the first micro-light-emitting diode chips 12-1 may have a larger width than the top surface S6 of the transparent structure 122 in the second micro-light-emitting diode chips 12-2. FIG. 9 schematically shows that the width of the top surface S6 of the transparent structure 122 in the second micro-light-emitting diode chips 12-2 is equal to the width of the top surface S6 of the transparent structure 122 in the third micro-light-emitting diode chips 12-3, but the width of these top surfaces S6 may be changed as needed.

Please refer to FIG. 10, a micro-light-emitting diode display 7 is similar to the micro-light-emitting diode display 1 of FIG. 3, and the main differences between the two are as follows.

Figure 10:
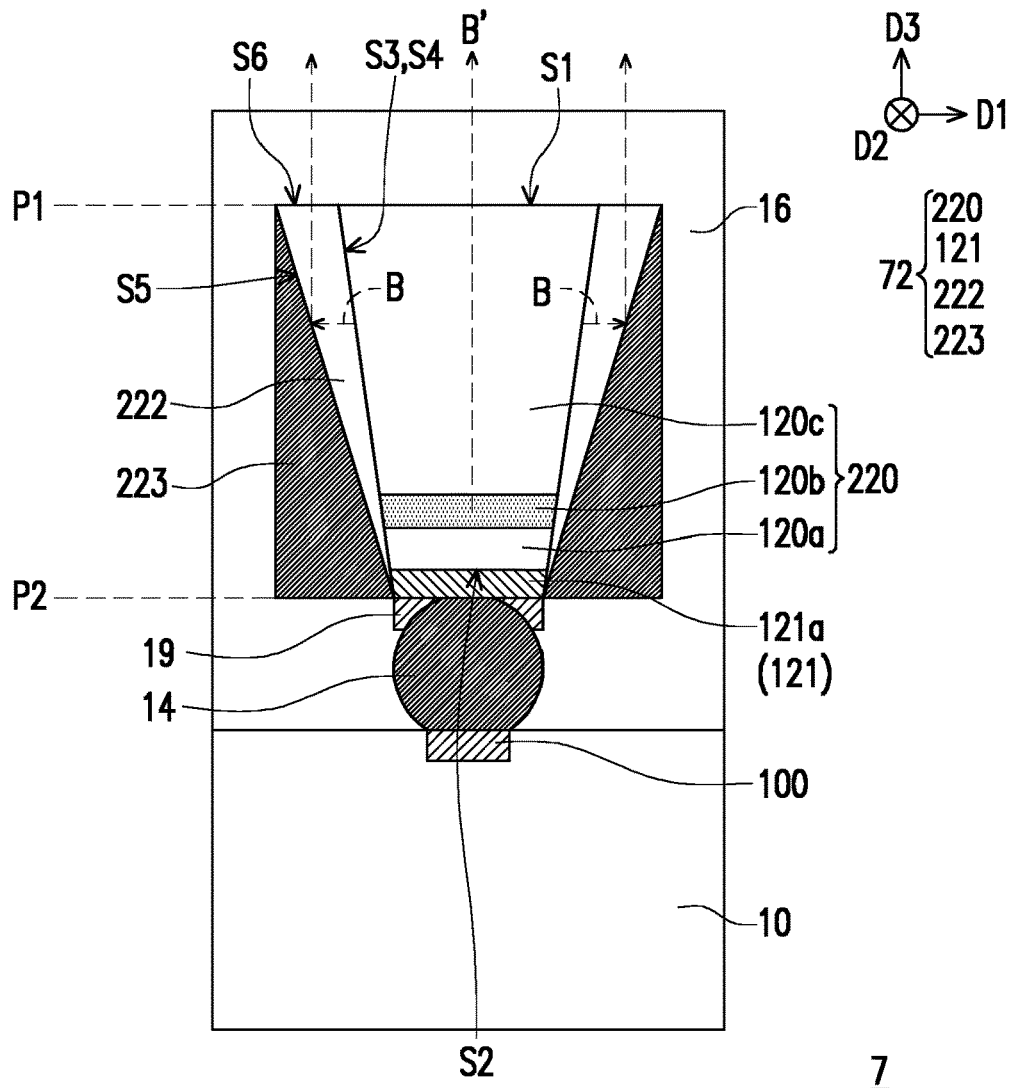

In FIG. 10, a micro-light-emitting diode chip 72 is, for example, a vertical structure-type light-emitting diode chip, wherein the first electrode 121a is disposed under the first-type semiconductor layer 120a and in contact with the first-type semiconductor layer 120a. A second electrode (not shown) is disposed on the second-type semiconductor layer 120c and in contact with the second-type semiconductor layer 120c. The second electrode is, for example, a transparent electrode to reduce the probability of shielding a forward-emitting light B'.

The micro-light-emitting diode display 7 may further include a reflection structure 19. The reflection structure 19 is disposed on the lower surface of the first electrode 121a and exposes a part of the lower surface of the first electrode 121a, and the conductive bump 14 may be in direct contact with the first electrode 121a exposed by the reflection structure 19. The reflection structure 19 may be a conductive reflection layer. In this way, in addition to the reflective function, the reflection structure 19 also has the function of electrically connecting the conductive bump 14.

In other embodiments not shown, the epitaxial structure 220 may also be replaced with the epitaxial structure 120 of FIG. 3 (the sidewall surface S3 is a vertical surface). In addition, the reflection layer 223 may also be replaced with the reflection layer 223 (reflective thin film) of FIG. 5.

Based on the above, in an embodiment of the invention, by disposing a transparent structure with an inclined surface or a curved surface on the sidewall of the epitaxial structure and disposing a reflection layer on the inclined surface or the curved surface of the transparent structure, lateral light may be reflected using the reflection layer, so that the lateral light is turned to the forward direction and emitted from micro-light-emitting diode chip, thereby increasing the amount or brightness of the light emitted from the forward direction.

Although the invention has been described with reference to the above embodiments, it will be apparent to one of ordinary skill in the art that modifications to the described embodiments may be made without departing from the spirit of the disclosure. Accordingly, the scope of the disclosure is defined by the attached claims not by the above detailed descriptions.

What is claimed is:

1. A micro-light-emitting diode display, comprising:
   a driving substrate; and
   a micro-light-emitting diode chip disposed on the driving substrate and comprising:
      an epitaxial structure having a light exit surface, a back surface, and a sidewall surface, wherein the back surface is opposite to the light exit surface, and the sidewall surface is connected to the light exit surface and the back surface;
      an electrode formed on the epitaxial structure and electrically coupled to the epitaxial structure;
      a transparent structure having an inner surface and an outer surface, wherein the inner surface is connected to the sidewall surface, the outer surface is opposite to the inner surface, and a distance between the outer surface and the inner surface on a plane where the back surface is located is less than a distance between the outer surface and the inner surface on a plane where the light exit surface is located; and
      a reflection layer in direct contact with the outer surface, wherein the micro-light-emitting diode chip is bonded on the driving substrate via the electrode, wherein the micro-light-emitting diode display comprises a plurality of the micro-light-emitting diode chips, the plurality of micro-light-emitting diode chips comprise a first micro-light-emitting diode chip and a second micro-light-emitting diode chip, and the outer surface of the transparent structure in the first micro-light-emitting diode chip has a smaller inclination angle than the outer surface of the transparent structure in the second micro-light-emitting diode chip.

2. The micro-light-emitting diode display of claim 1, wherein the transparent structure and the reflection layer are not in contact with the driving substrate.

3. The micro-light-emitting diode display of claim 1, wherein the transparent structure further has a top surface, and the top surface of the transparent structure in the first micro-light-emitting diode chip has a greater width than the top surface of the transparent structure in the second micro-light-emitting diode chip.

4. The micro-light-emitting diode display of claim 3, further comprising:
   a plurality of pixels, wherein each of the plurality of pixels comprises one of the first micro-light-emitting diode chip and one of the second micro-light-emitting diode chip, and a light-emitting wavelength of the first micro-light-emitting diode chip is greater than a light-emitting wavelength of the second micro-light-emitting diode chip.

5. The micro-light-emitting diode display of claim 1, further comprising:
   a plurality of the micro-light-emitting diode chip bonded on the driving substrate in an array;
   a light-shielding layer disposed on the driving substrate and located in a region outside the micro-light-emitting diode chips.

6. The micro-light-emitting diode display of claim 5, further comprising:
   an encapsulation layer disposed on the driving substrate and covering the plurality of micro-light-emitting diode chips.

7. The micro-light-emitting diode display of claim 1, wherein a refractive index of the transparent structure is between 1 and a refractive index of the epitaxial structure, and the transparent structure surrounds the sidewall surface of the epitaxial structure.

* * * * *